(12) United States Patent
Shim et al.

(10) Patent No.: US 9,583,734 B2
(45) Date of Patent: Feb. 28, 2017

(54) OLED MICRO-CAVITY STRUCTURE AND METHOD OF MAKING

(71) Applicant: LG Display Co., Ltd., Yeongdeungpo-Gu, Seoul (KR)

(72) Inventors: Sungbin Shim, Goyang-si (KR); Se June Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/860,282

(22) Filed: Apr. 10, 2013

(65) Prior Publication Data

US 2014/0191202 A1 Jul. 10, 2014

(30) Foreign Application Priority Data

Jan. 4, 2013 (KR) .................. 10-2013-0001321

(51) Int. Cl.
*H01L 29/08* (2006.01)
*H01L 51/52* (2006.01)
*H01L 51/56* (2006.01)
*H01L 27/32* (2006.01)

(52) U.S. Cl.
CPC ...... *H01L 51/5265* (2013.01); *H01L 27/3211* (2013.01); *H01L 27/3213* (2013.01); *H01L 51/56* (2013.01); *H01L 27/322* (2013.01); *H01L 27/3206* (2013.01); *H01L 51/5209* (2013.01); *H01L 51/5215* (2013.01); *H01L 51/5218* (2013.01); *H01L 2227/323* (2013.01)

(58) Field of Classification Search
CPC ......... H01L 2251/5315; H01L 27/3211; H01L 51/5218; H01L 51/5265

USPC .............................. 257/40, 88–93
See application file for complete search history.

(56) References Cited

U.S. PATENT DOCUMENTS

| | | | |
|---|---|---|---|
| 2002/0135297 A1 | 9/2002 | Maeda | |
| 2005/0017630 A1 | 1/2005 | Ryu et al. | |
| 2005/0073230 A1* | 4/2005 | Nishikawa et al. | .......... 313/111 |
| 2005/0142976 A1 | 6/2005 | Suzuki | |
| 2005/0225232 A1 | 10/2005 | Boroson et al. | |
| 2006/0131582 A1 | 6/2006 | Jeon et al. | |
| 2006/0250074 A1 | 11/2006 | Lee et al. | |
| 2007/0075305 A1 | 4/2007 | Miyata et al. | |
| 2008/0102599 A1 | 5/2008 | Yang | |

(Continued)

FOREIGN PATENT DOCUMENTS

| | | |
|---|---|---|
| CN | 1578568 A | 2/2005 |
| CN | 1638547 A | 7/2005 |

(Continued)

OTHER PUBLICATIONS

English Translation of KR 10-0752384.

(Continued)

*Primary Examiner* — John C Ingham
*Assistant Examiner* — Frederick B Hargrove
(74) *Attorney, Agent, or Firm* — Polsinelli PC

(57) ABSTRACT

An organic light emitting diode, including: a substrate; a first cavity electrode in a first micro-cavity region of the substrate; a first transparent electrode of a first thickness in the first micro-cavity region, the first transparent electrode overlaps beyond a first side of the first cavity electrode; a first emissive layer in electrical connection with the first transparent electrode; and a cathode layer on the first emissive layer.

17 Claims, 16 Drawing Sheets

(56) References Cited

U.S. PATENT DOCUMENTS

| | | | |
|---|---|---|---|
| 2008/0111474 A1* | 5/2008 | Sung et al. | 313/504 |
| 2009/0283786 A1 | 11/2009 | Kobayashi et al. | |
| 2009/0295282 A1* | 12/2009 | Yoon | H01L 51/5265 313/504 |
| 2010/0026178 A1* | 2/2010 | Hwang | H01L 51/5215 313/506 |
| 2010/0051973 A1* | 3/2010 | Kobayashi et al. | 257/88 |
| 2010/0053044 A1 | 3/2010 | Lee et al. | |
| 2011/0084257 A1* | 4/2011 | Kwon et al. | 257/40 |
| 2011/0241000 A1* | 10/2011 | Choi | H01L 51/5218 257/59 |
| 2013/0048972 A1 | 2/2013 | Matsubara | |

FOREIGN PATENT DOCUMENTS

| | | |
|---|---|---|
| CN | 1794066 A | 6/2006 |
| CN | 1941404 A | 4/2007 |
| CN | 101174608 A | 5/2008 |
| CN | 101582440 A | 11/2009 |
| CN | 101661997 A | 3/2010 |
| CN | 102834914 A | 12/2012 |
| JP | 3714179 B2 | 11/2005 |
| JP | 2010-050014 A | 3/2010 |
| KR | 10-2005-0012995 A | 2/2005 |
| KR | 10-0752384 B1 | 8/2007 |
| WO | 2005/101541 A1 | 10/2005 |

OTHER PUBLICATIONS

International Search Report.
English language abstract of JP 2010-050014 A, published Mar. 4, 2010.
Extended European Search Report issued Jul. 19, 2016 in the corresponding European patent application No. 13 870 270.9.
Chinese Office Action issued May 5, 2016 in the corresponding Chinese patent application No. 2013800693530 with English language translation.
English language abstract of CN1638547 (A), published Jul. 13, 2005.
English language abstract of CN101661997 (A), published Mar. 3, 2010.
English language abstract of CN1941404 (A), published Apr. 4, 2007.
Chinese Office Action issued Oct. 9, 2016 in the corresponding Chinese patent application No. 201380069353.0 with translation.

* cited by examiner

OLED MICRO-CAVITY STRUCTURE AND METHOD OF MAKING

BACKGROUND OF THE INVENTION

Field of the Invention

This application claims the benefit of Korean Patent Application No. 10-2013-0001321, filed on Jan. 4, 2013, which is hereby incorporated by reference as if fully set forth herein. Embodiments of the invention relate to an organic light emitting diode, and more particularly, to an organic light emitting diode micro-cavity structure and method of making. Although embodiments of the invention are suitable for a wide scope of applications, it is particularly suitable for a matrix structure having at least three sub-pixel regions.

Discussion of the Related Art

In general, an organic electroluminescent (EL) device, also known as organic light-emitting diode device or OLED device, can emit light at a predetermined color wavelength. An OLED device includes an anode for hole injection, a cathode for electron injection, and an organic emissive layer, sandwiched between the anode and cathode to enable hole and electron recombination that yields an emission of light. OLED devices can be stacked on top of one another so that one emissive layer emits one color and an other emissive layer emits another color such that the colors combine to form one or more colors. To construct a pixilated color display device such as a television, computer monitor, cell phone display, or digital camera display, individual OLED devices or stacked OLED devices can be arranged as a matrix array of pixels.

In order for each pixel to produce multiple colors, the pixels are divided into sub-pixel regions with each sub-pixel region having an OLED device for emitting a predetermined peak color wavelength or a plurality of color wavelengths. Generally, a color pixel display is made of one of two pixel types. The first pixel type is the RGB pixel type that has red, green and blue sub-pixel regions. The second pixel type is the RGBW pixel type that has red, green, blue and white sub-pixel regions. Red, green and blue sub-pixel regions emit predetermined peak color wavelengths of red, green and blue, respectively. A white sub-pixel region emits a plurality of color wavelengths. In addition to the RGB and RGBW pixel types, there are other display pixel types having sub-pixel regions with other predetermined peak color wavelengths, such as a RGCM pixel type having sub-pixel regions that emit with peak color wavelengths of red, green, cyan and magenta.

A matrix of pixels can be electrically driven using either a passive matrix or an active matrix driving scheme. In a passive matrix, the OLED sub-pixel regions are sandwiched between two sets of orthogonal electrodes arranged in rows and columns. In an active matrix configuration, each OLED device of a sub-pixel region is activated by switching element and driving element, such as transistors.

There are three basic approaches to using OLED device structures to produce a color display. The first approach uses different organic electroluminescent materials for the emissive layers in the sub-pixels of a pixel to emit different predetermined peak color wavelengths. The second approach uses a same organic electroluminescent material for each emissive layer along with different color filters in each sub-pixel region to emit different predetermined peak color wavelengths. The third approach uses different organic electroluminescent materials for the emissive layers along with along with different color filters in each sub-pixel region to emit different predetermined peak color wavelengths.

In the first approach of using different organic electroluminescent materials without color filters, each differently colored sub-pixel region can be constructed using different organic electroluminescent materials for each of the emissive layers of the OLED devices in the sub-pixel regions of the pixels. For example, a first organic electroluminescent material emits a peak red wavelength, a second organic electroluminescent material emits a peak green wavelength, and a third organic electroluminescent material emits a peak blue wavelength. These three different organic electroluminescent materials are each selectively positioned within their respective sub-pixel regions of the pixels by using one of shadow masks, thermal transfers from donor sheets, and ink jet printing.

In the second approach of using a same organic electroluminescent material for each emissive layer along with different color filters in each sub-pixel region to emit different predetermined peak color wavelengths to producing a color display, the same organic electroluminescent material in all of the different color sub-pixel regions can be either a continuous layer across all of the sub-pixel regions or individual layers position respectively in each sub-pixel region. The different color filters used to selectively convert the common color wavelength emitted from each OLED device to the different colors of the sub-pixel regions are positioned above the emissive layer in a top emission device and below the emissive layer in bottom emission device. In the case of using the same organic electroluminescent material in the emissive layer of all of the sub-pixel regions, the organic electroluminescent material is typically configured to produce a broad emission spectrum of light, also referred to as white emission or white light OLED.

In the third approach of using different organic electroluminescent materials for the emissive layers along with different color filters, each differently colored sub-pixel region can be constructed using different organic electroluminescent materials for each of the emissive layers of the OLED devices in the sub-pixel regions of the pixels. For example, a first organic electroluminescent material emits a peak red wavelength, a second organic electroluminescent material emits a peak green wavelength, a third organic electroluminescent material emits a peak blue wavelength and a fourth organic electroluminescent material emits a broad spectrum of wavelengths or white light. In this example, a red filter is associated with the first organic electroluminescent material that emits a peak red wavelength, a green filter is associated with the second organic electroluminescent material that emits a peak green wavelength, a blue filter is associated with the third organic electroluminescent material that emits a peak blue wavelength.

To improve the luminance output efficiency of the OLED devices in all three of the above approaches, the micro-cavity effect can be used. In a micro-cavity OLED device, the emissive layer structure is disposed between a reflector and a semi-transmissive reflector, which is at least semi-transparent to a desired wavelength. The reflector and semi-transmissive reflector form a Fabry-Perot micro-cavity that enhances the emission properties of the emissive layer structure disposed in the micro-cavity. More specifically, light emission near the wavelength corresponding to the resonance wavelength of the cavity is enhanced through the cathode while diminishing other wavelengths that do not correspond to the resonance wavelength. The use of a micro-cavity in an OLED device increases the light extraction efficiency or luminance output by configuring the depth or length of micro-cavity between a reflective electrode and a cathode of a sub-pixel region to have a resonance wavelength corresponding to the desired peak color wavelength for the sub-pixel region.

FIG. 1 is a view of three sub-pixel regions that each having a top emission OLED micro-cavity structure according to the prior art. As shown in FIG. 1, red sub-pixel region R, green sub-pixel region G and blue sub-pixel region B are formed on a substrate 101. The red sub-pixel region R includes a red emissive layer 151 positioned between a common cathode 160 and an anode 120R for the red sub-pixel region R. The green sub-pixel region G includes a green emissive layer 152 positioned between a common cathode 160 and an anode 120G for the green sub-pixel region G. The blue sub-pixel region B includes a blue emissive layer 153 positioned between a common cathode 160 and an anode 120B for the blue sub-pixel region B. The anode 120R for the red sub-pixel region R is on a cavity electrode 110R, which is on the substrate 101. The anode 120B for the blue sub-pixel region B is on a cavity electrode 110B, which is on the substrate 101. The anode 120G for the green sub-pixel region G is on a cavity electrode 110G, which is on the substrate 101. The red sub-pixel region R, green sub-pixel region G and blue sub-pixel region B are separated by banks 140.

The depth of a micro-cavity between a reflective electrode and a cathode of a sub-pixel region in the prior art is configured by controlling the thickness of the emissive layer. As shown in FIG. 1, the depth of the micro-cavity CDR in the red sub-pixel region R between the common cathode 160 and cavity electrode 110R for the red sub-pixel region R is larger than the depth of the micro-cavity CDG in the green sub-pixel region G between the common cathode 160 and the cavity electrode 110G for the green sub-pixel region G because the red emissive layer 151 of the red sub-pixel region R is thicker than the green emissive layer 152 of the green sub-pixel region G. The depth of the micro-cavity CDB in the blue sub-pixel region B between the common cathode 160 and the cavity electrode 110B for the blue sub-pixel region B is smaller than the depth of the micro-cavity CDG of the green sub-pixel region G between the common cathode 160 and the cavity electrode 110G for the green sub-pixel region G because the blue emissive layer 153 of the blue sub-pixel region B is thinner than the green emissive layer 152 of the green sub-pixel region G.

As shown in FIG. 1, the red color light RCL reflects back and forth between the common cathode 160 and the cavity electrode 110R across the entire depth of the micro-cavity CDR such that the luminance of the red color light RCL increases by constructive interference. The green color light GCL reflects back and forth between the common cathode 160 and the cavity electrode 110G across the entire depth of the micro-cavity GDR such that the luminance of the green color light GCL increases by constructive interference. The blue color light BCL reflects back and forth between the common cathode 160 and the cavity electrode 110B across the entire depth of the micro-cavity CDB such that the luminance of the blue color light BCL increases by constructive interference.

The effective micro-cavity depth is defined by optical distance, which is wavelength. The depth of the micro-cavity CDR for the red sub-pixel region R is configured to be deeper than the depth of the micro-cavity CDB for the blue sub-pixel region B because the wavelength of the red color light RCL is longer than the wavelength of blue color light BCL. The depth of the micro-cavity CDG for the green sub-pixel region G is configured to be deeper than the depth of the micro-cavity CDB for the blue sub-pixel region B because the wavelength of the green color light GCL is longer than the wavelength of blue color light BCL. The depth of the micro-cavity CDR for the red sub-pixel region R is configured to be deeper than the depth of the micro-cavity CDG for the red sub-pixel region G because the wavelength of the red color light RCL is longer than the wavelength of green color light GCL.

Controlling the thickness of the emissive layers is difficult. More specifically, the prior art structure requires a separate deposition process for each sub-pixel region because each emissive layer is typically a series of sub-layers whose thicknesses vary depending on the overall thickness of the emissive layer for that sub-pixel region. Further, the emissive layers can not be highly defined using the fine metal mask evaporation technique. Also, patterning of the transparent anode electrode in the prior art can result in left over residue that can result in a short circuit between adjacent pixel regions.

SUMMARY OF THE INVENTION

Embodiments of the invention is directed to an organic light emitting diode micro-cavity structure and method of making that substantially obviates one or more of the problems due to limitations and disadvantages of the related art.

An object of embodiments of the invention is to provide an anode layer for each sub-pixel region configured to have a predetermined overall thickness to provide a predetermined distance between the reflective electrode and the cathode layer according to a peak color wavelength for each sub-pixel region.

Another object of embodiments of the invention is to prevent a short circuit between adjacent sub-pixel regions.

Another object of embodiments of the invention is to form an emissive layer of a same thicknesses in each sub-pixel region having a micro-cavity structure.

Another object of embodiments of the invention is to reduce the number of masks used to form anodes and cavity electrodes in sub-pixel regions having micro-cavity structures.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, an organic light emitting diode includes: a substrate; a first cavity electrode in a first micro-cavity region of the substrate; a first transparent electrode of a first thickness in the first micro-cavity region, the first transparent electrode overlaps beyond a first side of the first cavity electrode; a first emissive layer in electrical connection with the first transparent electrode; and a cathode layer on the first emissive layer.

In another aspect, an organic light emitting diode on a substrate includes: a first reflective electrode having a first width in a first micro-cavity region of the substrate; a first transparent electrode having a second width and positioned on the first reflective electrode, wherein the second width is larger than the first width; a first emissive layer in electrical connection with the first transparent electrode; and a cathode layer on the first emissive layer.

In another aspect, an organic light emitting diode on a substrate includes: a first cavity electrode having a first width in a first sub-pixel region of the substrate; a first transparent electrode having a second width and positioned on the first cavity electrode, wherein the second width is larger than the first width; a first emissive layer in electrical connection with the first transparent electrode; and a cathode layer on the first emissive layer.

In another aspect, an organic light emitting diode includes: a substrate; an first sub-pixel region, a second sub-pixel region, and a third sub-pixel region on the substrate; a first cavity electrode in the first sub-pixel region of the substrate; a second cavity electrode in the second sub-pixel region of the substrate; a third cavity electrode in the third sub-pixel region of the substrate; a first transparent electrode of a first thickness in the first sub-pixel region, the first transparent electrode overlaps beyond a side of the first cavity electrode; second transparent electrodes of a second thickness in the first sub-pixel and second sub-pixel regions, the second transparent electrode in the second sub-pixel region overlaps beyond a side of the second cavity electrode; third transparent electrodes of a third thickness in the first sub-pixel, second sub-pixel, third sub-pixel regions, the third transparent electrode in the third sub-pixel region overlaps beyond a side of the third cavity electrode; an emissive layer being in electrical connection with the first, second and third transparent electrodes; and a cathode layer on the emissive layer.

In another aspect, an organic light emitting diode on a substrate includes: an R sub-pixel region, a G sub-pixel region, and a B sub-pixel region on the substrate; a first reflective electrode in the R sub-pixel region of the substrate; a second reflective electrode in the G sub-pixel region of the substrate; a third reflective electrode in the B sub-pixel region of the substrate; a first transparent electrode of a first thickness in the R sub-pixel region, the first transparent electrode overlaps beyond a side of the first reflective electrode; second transparent electrodes of a second thickness in the R sub-pixel and G sub-pixel regions, the second transparent electrode in the G sub-pixel region overlaps beyond a side of the second reflective electrode; third transparent electrodes of a third thickness in the R sub-pixel, G sub-pixel, B sub-pixel regions, the third transparent electrode in the B sub-pixel region overlaps beyond a side of the third reflective electrode; an emissive layer is in electrical connection with the first, second and third transparent electrodes; and a cathode layer on the emissive layer.

In another aspect, a method of making an organic light emitting diode on a substrate includes: forming a cavity electrode layer across first, second and third micro-cavity regions of the substrate; forming a first transparent layer of a first thickness in the first micro-cavity region; forming second transparent layers of a second thickness in the first and second micro-cavity regions; forming third transparent layers of a third thickness in the first, second and third micro-cavity regions; etching the cavity electrode layer such that the first transparent layer in the first micro-cavity region overlaps beyond a first side of a first cavity electrode, the second transparent layer in the second micro-cavity region overlaps beyond a second side of a second cavity electrode, and the third transparent layer in the third micro-cavity region overlaps beyond a third side of a third cavity electrode; forming a first bank between the first and second micro-cavity regions and a second bank between the second and third micro-cavity regions; forming a first emissive layer in electrical connection with the third transparent layer of the first micro-cavity region; forming a second emissive layer in electrical connection with the second transparent layer of the second micro-cavity region; forming a third emissive layer in electrical connection with the third transparent layer of the third micro-cavity region; and forming a cathode layer on the first, second and third emissive layers.

In yet another aspect, a method of making an organic light emitting diode on a substrate includes: forming a cavity electrode layer across first, second and third micro-cavity regions of the substrate; forming a first transparent layer of a first thickness in the first, second and third micro-cavity region; forming second transparent layers of a second thickness in the first and second micro-cavity regions; forming third transparent layers of a third thickness in the first micro-cavity regions; etching the cavity electrode layer such that the first transparent layer in the first micro-cavity region overlaps beyond a first side of a first cavity electrode, the first transparent layer in the second micro-cavity region overlaps beyond a second side of a second cavity electrode, and the first transparent layer in the third micro-cavity region overlaps beyond a third side of a third cavity electrode; forming a first bank between the first and second micro-cavity regions and a second bank between the second and third micro-cavity regions; forming a first emissive layer in electrical connection with the third transparent layer of the first micro-cavity region; forming a second emissive layer in electrical connection with the second transparent layer of the second micro-cavity region; forming a third emissive layer in electrical connection with the first transparent layer of the third micro-cavity region; and forming a cathode layer on the first, second and third emissive layers.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention.

DETAILED DESCRIPTION OF THE PREFERRED EMBODIMENTS

Figure 1:
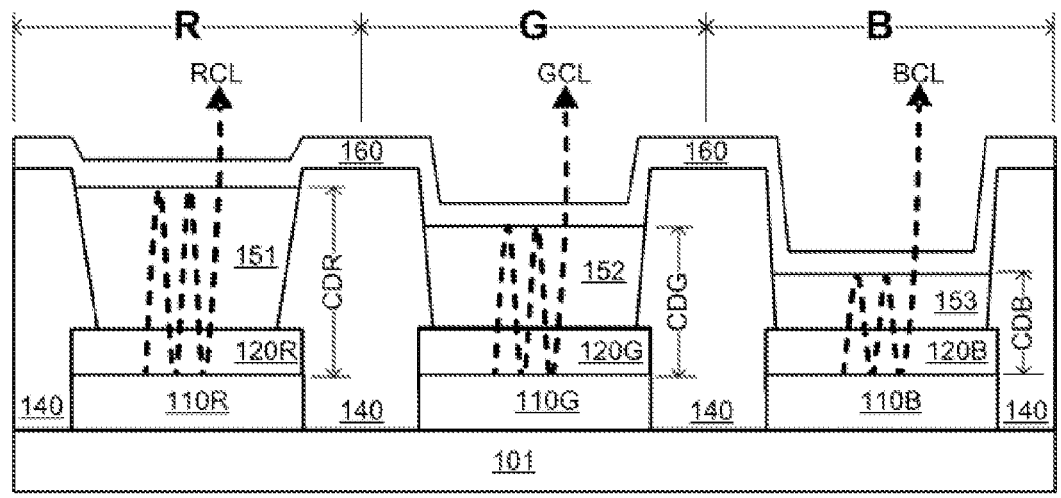
FIG. 1 is a view of three sub-pixel regions that each having a top emission OLED micro-cavity structure according to the prior art.

Reference will now be made in detail to the preferred embodiments of the invention, examples of which are illustrated in the accompanying drawings. The invention may, however, be embodied in many different forms and should not be construed as being limited to the embodiments set forth herein; rather, these embodiments are provided so that this disclosure will be thorough and complete, and will convey the concept of the invention to those skilled in the art. In the drawings, the thicknesses of layers and regions are exaggerated for clarity. Like reference numerals in the drawings denote like elements.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The same reference numbers indicate the same components throughout the specification.

It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the present invention.

The word "an organic light emitting display device of top emission type" is used herein to mean an organic light-emitting display device in which light from organic light emitting elements is emitted to the top part of the organic light emitting display device and to mean an organic light emitting display device in which lights from organic light emitting elements is emitted in the direction to the opposite side of the substrate on which thin film transistors for operating the organic light emitting display device are formed.

The word "an organic light emitting display device of bottom emission type" is used herein to mean an organic light emitting display device in which light from organic light emitting elements is emitted to the bottom part of the organic light emitting display device and to mean an organic light emitting display device in which light from organic light emitting elements is emitted in the direction to the substrate on which thin film transistors for operating the organic light emitting display device are formed.

The word "an organic light emitting display device of double-sided emission type" is used herein to mean an organic light emitting display device in which light from organic light emitting elements is emitted to the top and the bottom part of organic light emitting display device. Each of organic light emitting display device of top emission type, bottom emission type and double-sided emission type can be arranged optimally, such that thin film transistors do not interfere in the emitting direction of organic light emitting elements by arranging thin film transistors, anode, and cathode to optimize respective emitting type.

The word "a flexible display device" is used herein to mean a display device in which flexibility is applied. The word can be used for equivalent meaning with bendable display apparatus, rollable display apparatus, unbreakable display apparatus, foldable display apparatus, etc. A flexible organic light emitting display device herein is one aspect of various flexible display devices.

The word "a transparent display device" is used herein to mean a display device in which at least part of screen area of the display device watched by viewers is transparent. Transparency of the transparent display device is used herein to mean transparency of which viewers could recognize the object in the back of the display device. For example, herein, the transparent display apparatus means a display device with at least 20% of transmittance.

Respectively, the features of various embodiments of the present invention can be combined or joined in part or as a whole, and as the skilled in the arts can understand, can be diversely interworked and operated. Each of embodiments may be practiced independently to each other, or practiced with associative relationships.

Figure 2:
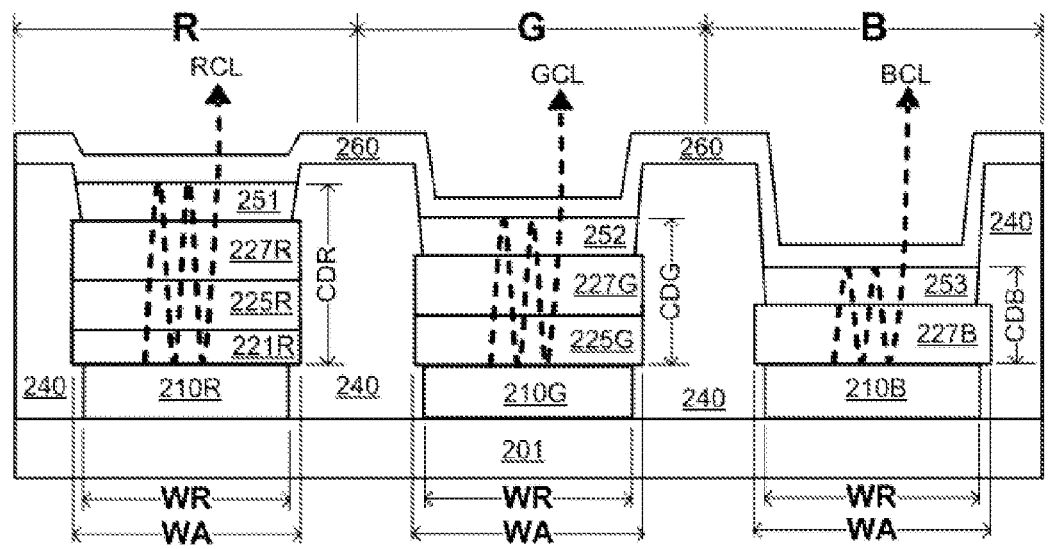
FIG. 2 is a view of three sub-pixel regions that each having a top emission OLED micro-cavity structure according to an exemplary embodiment of the invention.

FIG. 2 is a view of three sub-pixels regions that each having a top emission OLED micro-cavity structure according to an exemplary embodiment of the invention. As shown in FIG. 2, a red sub-pixel region R, a green sub-pixel region G and a blue sub-pixel region B are formed on a substrate 201. A cavity electrode 210R for the red sub-pixel region R is on the substrate 201. A first anode layer 221R, a second anode layer 225R and a third anode layer 227R are stacked on the cavity electrode 210R. A cavity electrode 210G for the green sub-pixel region G is on the substrate 201. A first anode layer 225G and a second anode layer 227G are stacked on the cavity electrode 210G. The cavity electrode 210B for the blue sub-pixel region B is on the substrate 201. A first anode layer 227B is on the cavity electrode 210B. The red sub-pixel region R includes a red emissive layer 251 positioned between a common cathode 260 and the third anode layer 227R. The green sub-pixel region G includes a green emissive layer 252 positioned between the common cathode 260 and the second anode layer 227G. The blue sub-pixel region B includes a blue emissive layer 253 positioned between the common cathode 260 and the first anode layer 227B. The red sub-pixel region R, green sub-pixel region G and blue sub-pixel region B are separated by banks 240. The red emissive layer 251, the green emissive layer 252, and the blue emissive layer 253 have a same thickness.

As shown in FIG. 2, the depth of the micro-cavity CDR in the red sub-pixel region R between the common cathode 260 and the cavity electrode 210R for the red sub-pixel region R is larger than the depth of the micro-cavity CDG in the green sub-pixel region G between the common cathode 260 and the cavity electrode 210G for the green sub-pixel region G. The depth of the micro-cavity CDB in the blue sub-pixel region B between the common cathode 260 and the cavity electrode 210B for the blue sub-pixel region B is smaller than the depth of the micro-cavity CDG of the green sub-pixel region G between the common cathode 260 and the cavity electrode 210G for the green sub-pixel region G. The depth of the micro-cavity CDR in the red sub-pixel region R is larger than the depth of the micro-cavity CDG in the green sub-pixel region G because the combination of the first anode layer 221R, second anode layer 225R and third anode layer 227R in the red sub-pixel region R is thicker than the combination of the first anode layer 225G and the second anode layer 227G in the green sub-pixel region G. The depth of the micro-cavity CDG in the green sub-pixel region G is larger than the depth of the micro-cavity CDB in the blue sub-pixel region B because the combination of the first anode layer 225G and the second anode layer 227G in the green sub-pixel region G is thicker than the first anode layer 227B in the blue sub-pixel region B.

As shown in FIG. 2, the depth of the micro-cavity can be varied to be the same optical distance as desired wavelength of light for the sub-pixel. The relative depths of one sub-pixel to another sub-pixel is not limited to the above embodiments. For example, the depth of micro-cavities for two adjacent sub-pixels may be the same while another sub-pixel has a micro-cavity with a different depth. The depths of the micro-cavities depends on the differences in thicknesses amongst the first anode layer, the second anode layer and the third anode layer as well which of the first anode layer, the second anode layer and the third anode layer are provided in the sub-pixel.

As shown in FIG. 2, the common cathode 260 is both reflective and semi-transmissive while the cavity electrode 210 is substantial reflective. In the alternative, the common cathode 260 could be formed of a first cathode layer in the first micro-cavity region, a second cathode layer in the second micro-cavity region, and a third cathode layer in the third micro-cavity region in which the first, second and third cathode layers are separate from one another. The red color light RCL reflects back and forth between the common cathode 260 and the cavity electrode 210R across the entire depth of the micro-cavity CDR such that the luminance of the red color light RCL increases by constructive interference. The green color light GCL reflects back and forth between the common cathode 260 and the cavity electrode 210G across the entire depth of the micro-cavity GDG such that the luminance of the green color light GCL increases by constructive interference. The blue color light BCL reflects back and forth between the common cathode 260 and the cavity electrode 210B across the entire depth of the micro-cavity CDB such that the luminance of the blue color light BCL increases by constructive interference.

The depth of the micro-cavity CDR for the red sub-pixel region R, shown in FIG. 2, is configured to be larger than the depth of the micro-cavity CDB for the blue sub-pixel region B because the wavelength of the red color light RCL is longer than the wavelength of blue color light BCL. The depth of the micro-cavity CDG for the green sub-pixel region G, shown in FIG. 2, is configured to be larger than the depth of the micro-cavity CDB for the blue sub-pixel region B because the wavelength of the green color light GCL is longer than the wavelength of blue color light BCL. The depth of the micro-cavity CDR for the red sub-pixel region R, shown in FIG. 2, is configured to be larger than the depth of the micro-cavity CDG for the green sub-pixel region G because the wavelength of the red color light RCL is longer than the wavelength of green color light GCL.

A width WA of the first anode layers 221R, 225G and 227B respectively in the sub-pixel regions R, G, and B is larger than a width WR of the cavity electrodes 210R, 210G, and 210B respectively in the sub-pixel regions R, G, and B. Because the width WA of the first anode layers 221R, 225G and 227B is wider than the width WR of the cavity electrodes 210R, 210G and 210B, the first anode layers 221R, 225G and 227B overlap beyond at least one side of the cavity electrodes 210R, 210G and 210B, respectively. The first anode layers 221R, 225G and 227B are transparent electrodes made of, for example, indium tin oxide (ITO). The cavity electrodes 210R, 210G and 210B can be made of reflective metals, such as silver or a silver alloy. The OLED micro-cavity structures in FIG. 2 are top emission device because the light emanating from the sub-pixel regions R, G, and B is reflected from the cavity electrodes 210R, 210G and 210B through the common cathode 260. In a top emission device, the cavity electrodes preferably have substantially reflection while the common cathode is both semi-transmissive and reflecting. In a bottom emission device, the cavity electrodes are both semi-transmissive and reflecting while the common cathode is substantially reflective.

Figure 3:
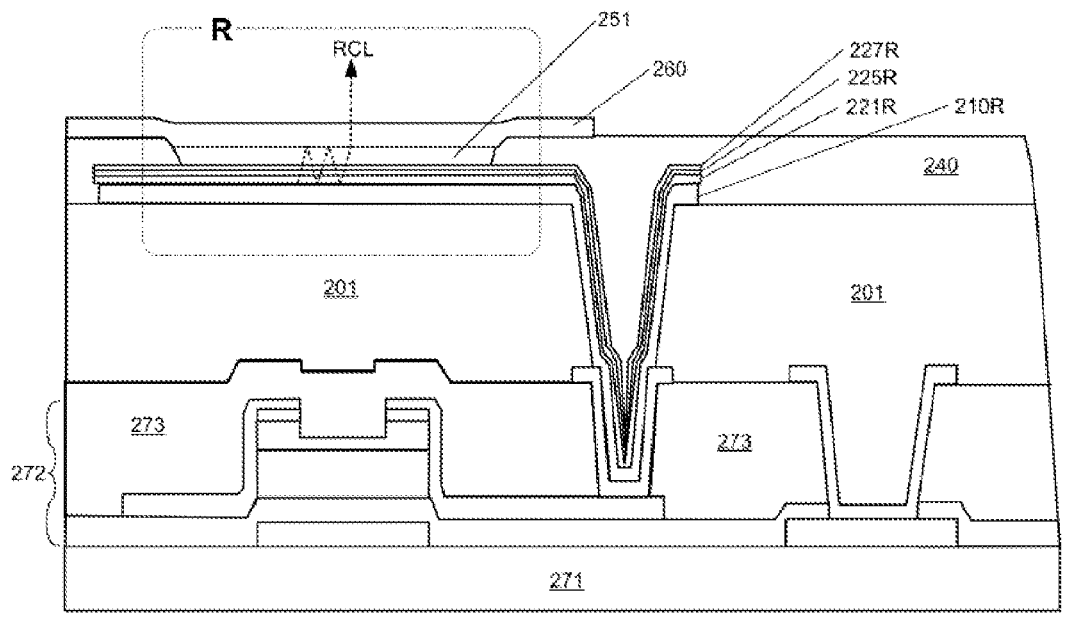
FIG. 3 is a view of a sub-pixel region having a top emission OLED micro-cavity structure connected to drive circuitry according to an exemplary embodiment of the invention.

FIG. 3 is a view of a sub-pixel region having a top emission OLED micro-cavity structure connected to drive circuitry according to an exemplary embodiment of the invention. As shown in FIG. 3, the cavity electrode 210R of the red sub-pixel region R can be contacted to a driving device 272 mounted on a display substrate 271. The substrate 271 for an OLED device can be a flattening layer on the passivation layer 273 overlying the driving device 272.

Figure 4:
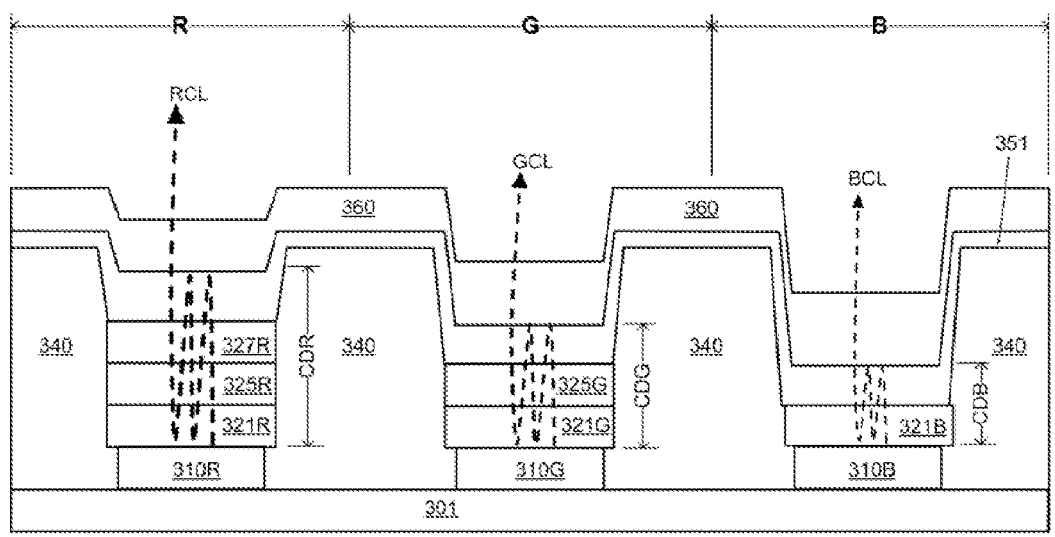
FIG. 4 is a view of three sub-pixel regions each having a top emission OLED micro-cavity structures according to an exemplary embodiment of the invention.

FIG. 4 is a view of three sub-pixel regions that each having a top emission OLED micro-cavity structures according to an exemplary embodiment of the invention. As shown in FIG. 4, a red sub-pixel region R, a green sub-pixel region G, and a blue sub-pixel region B are formed on a substrate 301. The cavity electrode 310R for the red sub-pixel region R is on the substrate 301. A first anode layer 321R, a second anode layer 325R and a third anode layer 327R are stacked on the cavity electrode 310R. The cavity electrode 310G for the green sub-pixel region G is on the substrate 301. A first anode layer 321G and a second anode layer 325G are stacked on the cavity electrode 310G. The cavity electrode 310B for the blue sub-pixel region B is on the substrate 301. A first anode layer 321B is on the cavity electrode 310B. A continuous white emissive layer 351 is positioned on the third anode layer 327R of the red sub-pixel region R, the second anode layer 325G of the green sub-pixel region G, the first anode layer 321B of the blue sub-pixel region B and the banks 340 between the sub-pixel regions. A common cathode 360 is formed on the white emissive layer 351. The red, green and blue sub-pixel regions R, G and B can have micro-cavity structures CDR, CDG and CDB with respective depths that correspond to the optical wavelength of the color emitted from the sub-pixel region.

As shown in FIG. 4, the common cathode 360 is both reflective and semi-transmissive. The red color light RCL reflects back and forth between the common cathode 360 and the cavity electrode 310R across the entire depth of the micro-cavity CDR such that the luminance of the red color light RCL increases by constructive interference. The green color light GCL reflects back and forth between the common cathode 360 and the cavity electrode 310G across the entire depth of the micro-cavity CDG such that the luminance of the green color light GCL increases by constructive interference. The blue color light BCL reflects back and forth between the common cathode 360 and the cavity electrode 310B across the entire depth of the micro-cavity CDB such that the luminance of the blue color light BCL increases by constructive interference.

Figure 5:
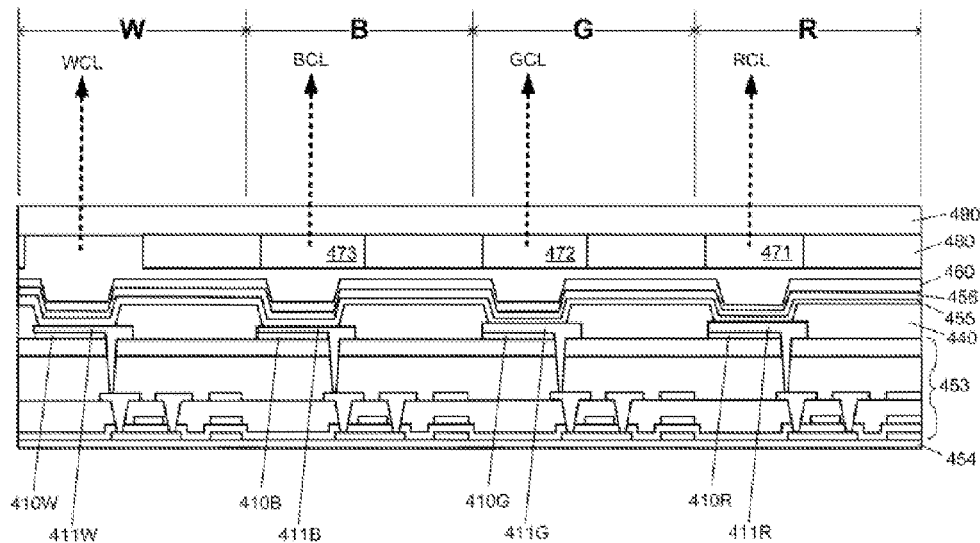
FIG. 5 is a view of four sub-pixel regions that each having a top emission OLED micro-cavity structures using color filters according to an exemplary embodiment of the invention.

FIG. 5 is a view of four sub-pixel regions that each having a top emission OLED micro-cavity structures using color filters according to an exemplary embodiment of the invention. The four sub-pixel regions shown in FIG. 5 have the same common cathode and anode layers shown in FIG. 4. The four sub-pixel regions in FIG. 5 are each shown with respective driving circuits 453 on a device substrate 454 and white emissive layers 455 and 456 are provided for each of the white, blue, green and red sub-pixel regions W, B, G and R over the banks layer 440 along with blue, green and red color filters 471, 472 and 473 for the blue, green and red sub-pixel regions B, G and R, respectively.

As shown in FIG. 5, the red, green, blue color filters 471, 472, 473 for the red, green, and blue sub-pixel regions R, G, and B are in a black matrix layer 480 over the common cathode 460. A transparent resin for the white sub-pixel region W may be in a black matrix layer 480 over the common cathode 460. A transparent cover layer 490 is on the black matrix 480. A continuous yellow emissive layer 456 on a continuous blue emissive layer 455 both form the white emissive layers 455 and 456. Other combinations of two or more color emissive layers can be used to form white emissive layers. In another alternative, the pair of yellow emissive layer on a blue emissive layer can be individually formed in each of the sub-pixel regions.

The overall thickness of the red anode layer 411R is larger than the overall thickness of the green anode layer 411G while the overall thickness of the blue anode layer 411B is less than the overall thickness of the green anode layer 411G. The red color light RCL comes from a red color filter 471 after a wavelength of light from the white emissive layers 455 and 456 reflects back and forth between the common cathode 460 and the cavity electrode 410R such that the luminance of the red color light RCL increases by constructive interference of the reflected light wavelength that comes through the red color filter 471. The green color light GCL comes from a green color filter 472 after a wavelength of light from the white emissive layers 455 and 456 comes reflects back and forth between the common cathode 460 and the cavity electrode 410G such that the luminance of the green color light GCL increases by constructive interference of the reflected wavelength of light that comes through the green color filter 472. The blue color light BCL comes from a blue color filter 473 after a wavelength of light from the white emissive layers 455 and 456 reflects back and forth between the common cathode 460 and the cavity electrode 410B such that the luminance of the blue color light BCL increases by constructive interference of the reflected wavelength of light that comes through the blue color filter 473. The white color light WCL comes from the transparent cover layer 490 after a wavelength of light from the white emissive layers 455 and 456 reflects back and forth between the common cathode 460 and the cavity electrode 410R. In the alternative, the white color light WCL may come from the transparent resin after a wavelength of light from the white emissive layers 455 and 456 reflects back and forth between the common cathode 460 and the cavity electrode 410R.

The white sub-pixel region W emits a broad spectrum of wavelengths, and can have internal reflection between the common cathode 460 and the cavity electrode 410W for the blue color wavelength of the white color light WCL, if the overall thickness of the white anode layer 411W is the same as the overall thickness of the blue anode layer 411B. In the alternative, the white sub-pixel region W can have internal reflection between the common cathode 460 and the cavity electrode 410W for the red color wavelength of the white color light WCL, if the overall thickness of the white anode layer 411W is the same as the overall thickness of the red anode layer 411R. In the alternative, the white sub-pixel region W can have internal reflection between the common cathode 460 and the cavity electrode 410W for the green color wavelength of the white color light WCL, if the overall thickness of the white anode layer 411W is the same as the overall thickness of the green anode layer 411G.

Figure 6:
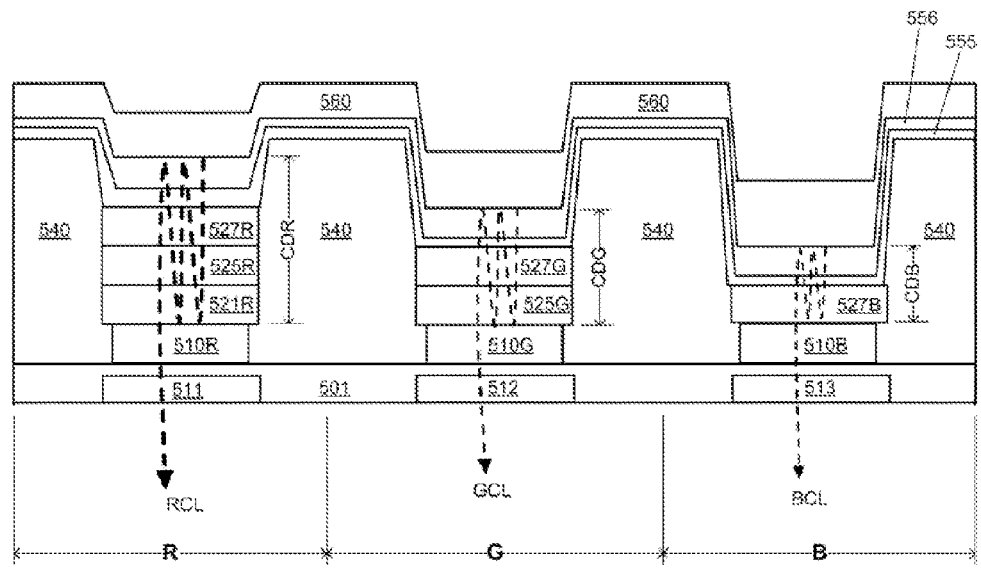
FIG. 6 is a view of three sub-pixel regions that each having a bottom emission OLED micro-cavity structure according to an exemplary embodiment of the invention.

FIG. 6 is a view of three sub-pixel regions that each having a bottom emission OLED micro-cavity structure according to an exemplary embodiment of the invention. As shown in FIG. 6, red sub-pixel region R, green sub-pixel region G and blue sub-pixel region B are formed on a substrate 501. The cavity electrode 510R for the red sub-pixel region R is on the substrate 501. A first anode layer 521R, a second anode layer 525R and a third anode layer 527R are stacked on the cavity electrode 510R. The cavity electrode 510G for the green sub-pixel region G is on the substrate 501. A first anode layer 525G and a second anode layer 527G are stacked on the cavity electrode 510G. The cavity electrode 510B for the blue sub-pixel region B is on the substrate 501. A first anode layer 527B is on the cavity electrode 510B. A yellow emissive layer 556 on a blue emissive layer 555 both form white emissive layers 555 and 556 in the red, green and blue sub-pixel regions R, G, and B. The white emissive layers 555 and 556 are positioned between the common cathode 560 and the third anode layer 527R in the red sub-pixel region R. The white emissive layers 555 and 556 are positioned between the common cathode 560 and the second anode layer 527G in the green sub-pixel region G. The white emissive layers 555 and 556 are positioned between the common cathode 560 and the first anode layer 527B in the blue sub-pixel region B. The third anode layer 527R in the red sub-pixel region R, the second anode layer 527G in the green sub-pixel region G, and the first anode layer 527B in the blue sub-pixel region B are separated by banks 540. In the alternative, emissive layers on each of the anode layers could be a red emissive layer in the red sub-pixel region, a green emissive layer in the green sub-pixel region and a blue emissive layer in the blue sub-pixel region.

As shown in FIG. 6, the depth of the micro-cavity CDR in the red sub-pixel region R between the common cathode 560 and the cavity electrode 510R for the red sub-pixel region R is larger than the depth of the micro-cavity CDG in the green sub-pixel region G between the common cathode 560 and the cavity electrode 510G for the green sub-pixel region G. The depth of the micro-cavity CDB in the blue sub-pixel region B between the common cathode 560 and the cavity electrode 510B for the blue sub-pixel region B is smaller than the depth of the micro-cavity CDG of the green sub-pixel region G between the common cathode 560 and the cavity electrode 510G for the green sub-pixel region G. The depth of the micro-cavity CDR in the red sub-pixel region R is larger than the depth of the micro-cavity CDG in the green sub-pixel region G because the combination of the first anode layer 521R, second anode layer 525R and third anode layer 527R in the red sub-pixel region R is thicker than the combination of the first anode layer 525G and second anode layer 527G in the green sub-pixel region G.

The depth of the micro-cavity CDG in the green sub-pixel region G is larger than the depth of the micro-cavity CDB in the blue sub-pixel region B because the combination of the first anode layer 525G and second anode layer 527G in the green sub-pixel region G is thicker than the first anode layer 527B in the blue sub-pixel region B.

As shown in FIG. 6, red, green and blue light RCL, GCL and BCL is emitted from the substrate 501. A red color filter 511 is in the substrate 501 corresponding to the cavity electrode 510R of the red sub-pixel region R. A green color filter 512 is in the substrate 501 corresponding to the cavity electrode 510G of the green sub-pixel region G. A blue color filter 513 is in the substrate 501 corresponding to the cavity electrode 510B of the blue sub-pixel region B.

As shown in FIG. 6, the common cathode 560 is substantially reflective and each of the cavity electrodes 510R, 510G and 513B are both semi-transmissive and reflecting. The red color light RCL comes from the red color filter 511 after a wavelength of light from the white emissive layers 555 and 556 reflects back and forth between the common cathode 560 and the cavity electrode 510R such that the luminance of the red color light RCL increases by constructive interference of the reflected light wavelength that comes through the red color filter 511. The green color light GCL comes from a green color filter 512 after a wavelength of light from the white emissive layers 555 and 556 comes reflects back and forth between the common cathode 560 and the cavity electrode 510G such that the luminance of the green color light GCL increases by constructive interference of the reflected wavelength of light that comes through the green color filter 572. The blue color light BCL comes from a blue color filter 513 after a wavelength of light from the white emissive layers 555 and 556 reflects back and forth between the common cathode 560 and the cavity electrode 510B such that the luminance of the blue color light BCL increases by constructive interference of the reflected wavelength of light that comes through the blue color filter 513.

As shown in FIG. 6, the cavity electrode 510R in the red sub-pixel region R, the cavity electrode 510G in the green sub-pixel region G, and the cavity electrode 510B in the blue sub-pixel region B are each both reflective and semi-transmissive. A cavity electrode that is both reflective and semi-transmissive can be a very thin layer of metal, such as silver, or a metal alloy, such as silver and magnesium. In the alternative, a cavity electrode that is both reflective and semi-transmissive can be a very thin layer of metal or metal alloy on a layer of transparent conductive material, such as ITO.

Figure 7:
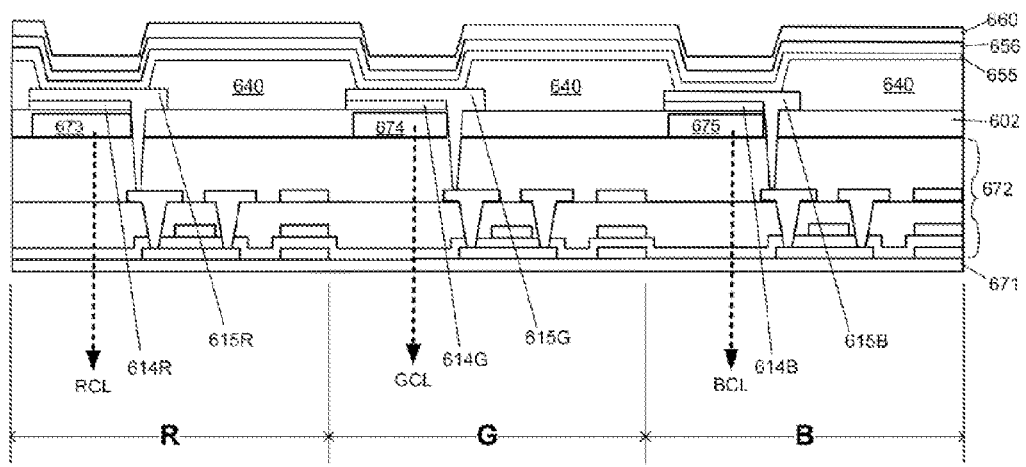
FIG. 7 is a view of three sub-pixel regions that each having a bottom emission OLED micro-cavity structure using color filters according to an exemplary embodiment of the invention.

FIG. 7 is a view of three sub-pixel regions that each having a bottom emission OLED micro-cavity structure using color filters according to an exemplary embodiment of the invention. The three sub-pixel regions R, G and B shown in FIG. 7 have the same common cathode and anode layers shown in FIG. 6. Unlike three sub-pixel regions in FIG. 6, the three sub-pixel regions in FIG. 7 are each shown with respective driving circuits 672 on a device substrate 671.

As shown in FIG. 7, the three sub-pixel regions R, G and B are separated by banks 640, The red, green and blue color filters 673, 674 and 675 for the red, green and blue red sub-pixel regions R, G and B are in a over-coating layer 602. The red color filter 673 is in the over-coating layer 602 under the semi-transmissive cavity electrode 614R in the red sub-pixel region R. The green color filter 674 is in the over-coating layer 602 under the semi-transmissive cavity electrode 614G in the green sub-pixel region G. The blue color filter 675 is in the over-coating layer 602 under the semi-transmissive cavity electrode 614B in the blue sub-pixel region B.

The overall thickness of the red anode layer 615R is larger than the overall thickness of the green anode layer 615G while the overall thickness of the blue anode layer 615B is less than the overall thickness of the green anode layer 615G. The red color light RCL comes from the red color filter 673 after a wavelength of light from the white emissive layers 655 and 656 reflect back and forth between the common cathode 660 and the cavity electrode 614R such that the luminance of the red color light RCL is increases by constructive interference of the reflected light wavelength through the red color filter 673. The green color light GCL comes from a green color filter 674 after a wavelength of light from the white emissive layers 655 and 656 reflects back and forth between the common cathode 660 and the cavity electrode 614G such that the luminance of the green color light GCL is increases by constructive interference of the reflected wavelength of light through the green color filter 674. The blue color light BCL comes from a blue color filter 675 after a wavelength of light from the white emissive layers 655 and 656 reflects back and forth between the common cathode 660 and the cavity electrode 614B such that the luminance of the blue color light BCL increases by constructive interference of the reflected wavelength of light through the blue color filter 675.

Figure 8A:
FIGS. 8A to 8O illustrate exemplary steps for a method of making three sub-pixel regions that each have a top emission OLED micro-cavity structure according to an exemplary embodiment of the invention.
Figure 8B:
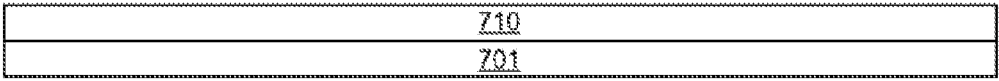
Figure 8C:
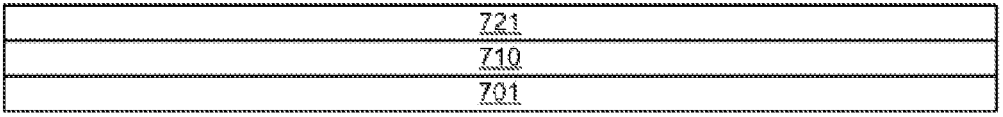
Figure 8D:
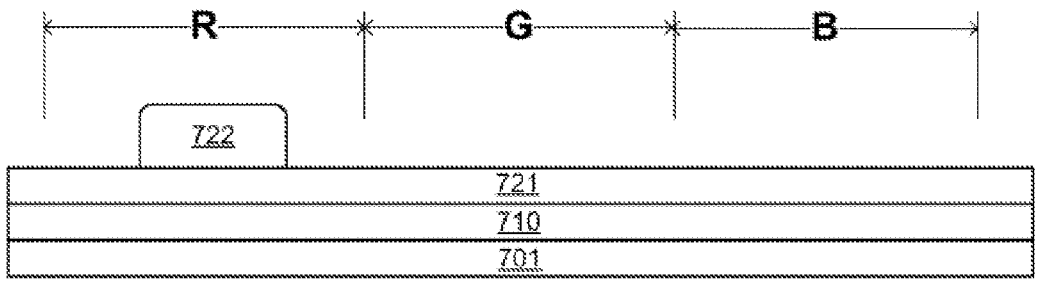
Figure 8E:
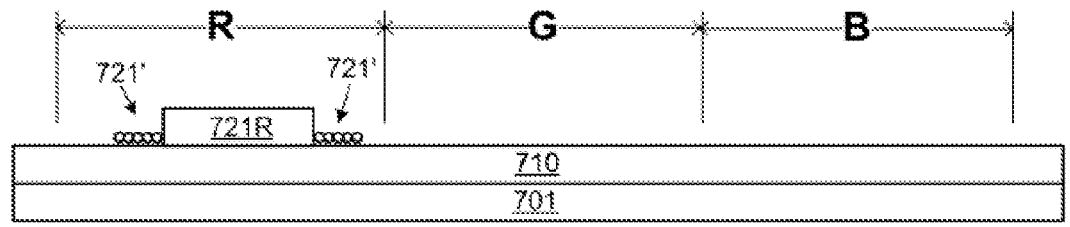
Figure 8F:
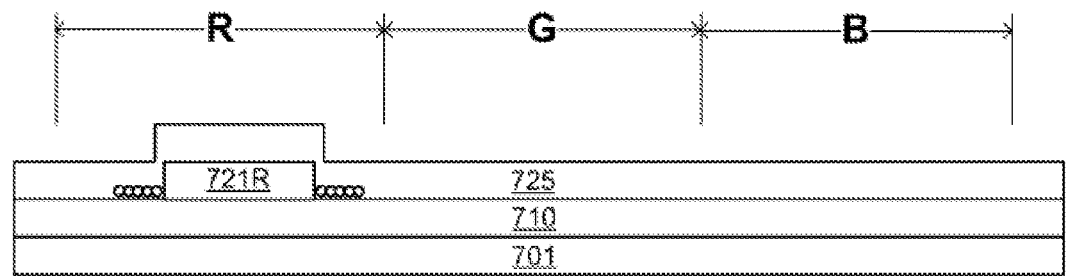
Figure 8G:
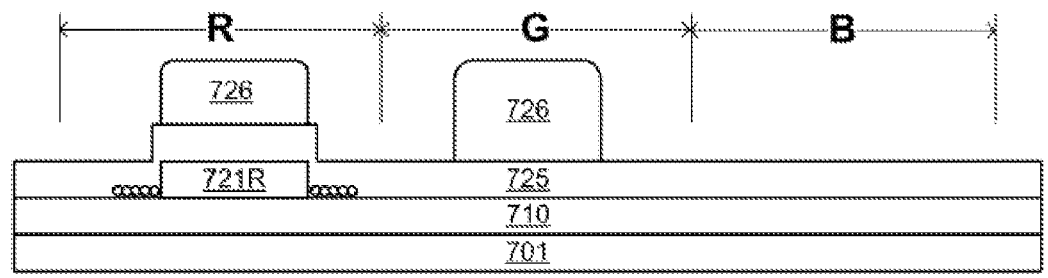
Figure 8H:
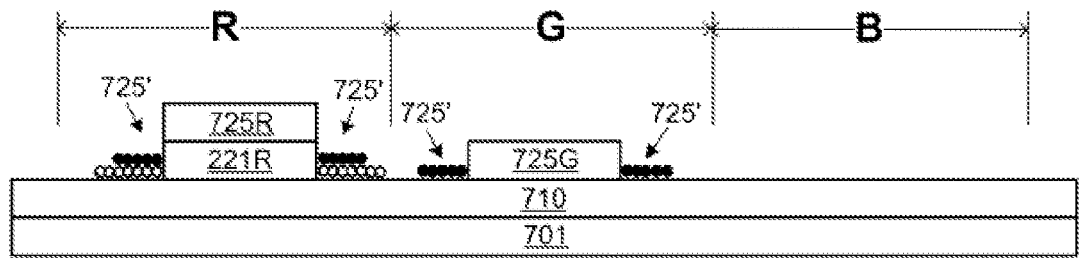
Figure 8I:
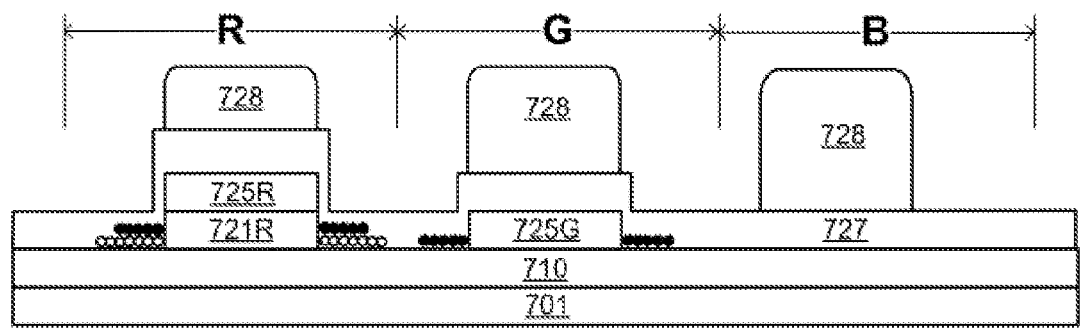
Figure 8J:
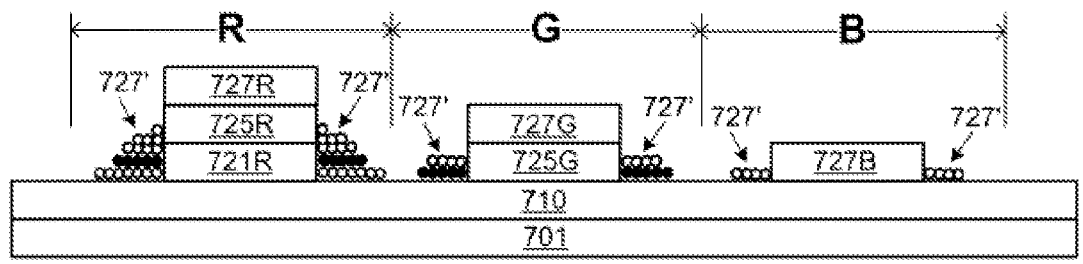
Figure 8K:
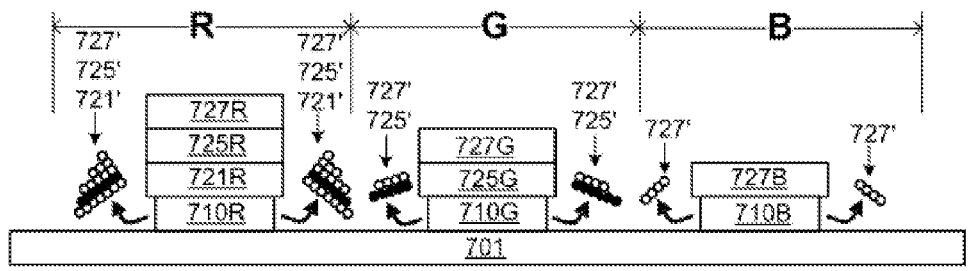
Figure 8L:
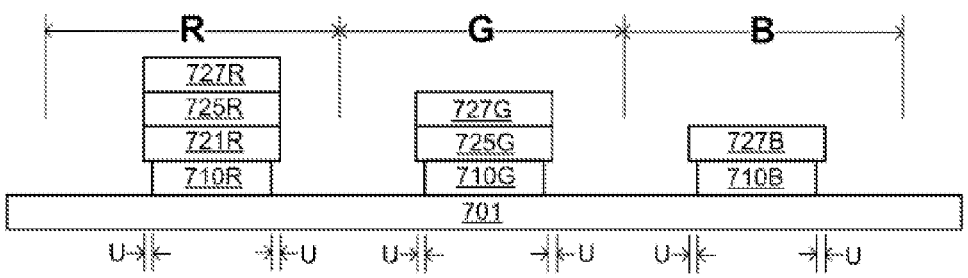
Figure 8M:
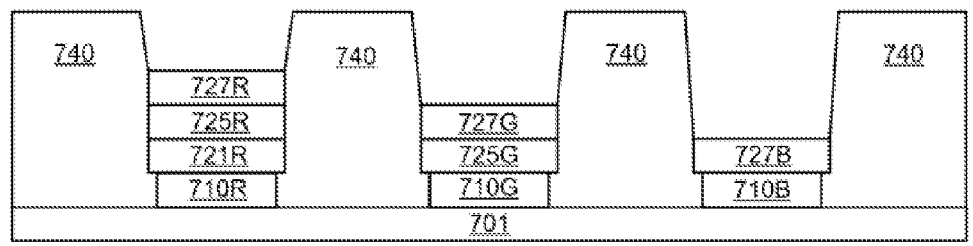
Figure 8N:
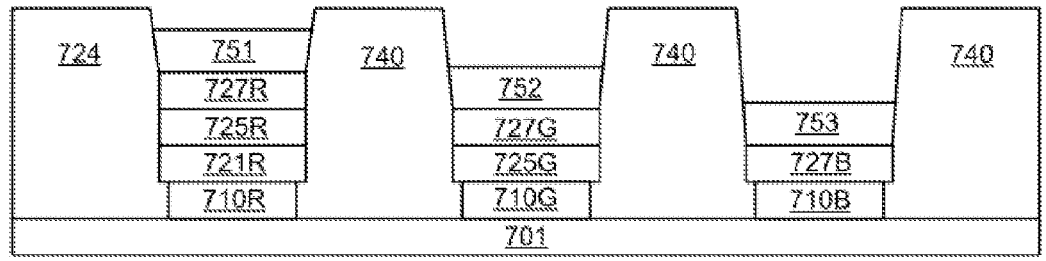
Figure 8O:
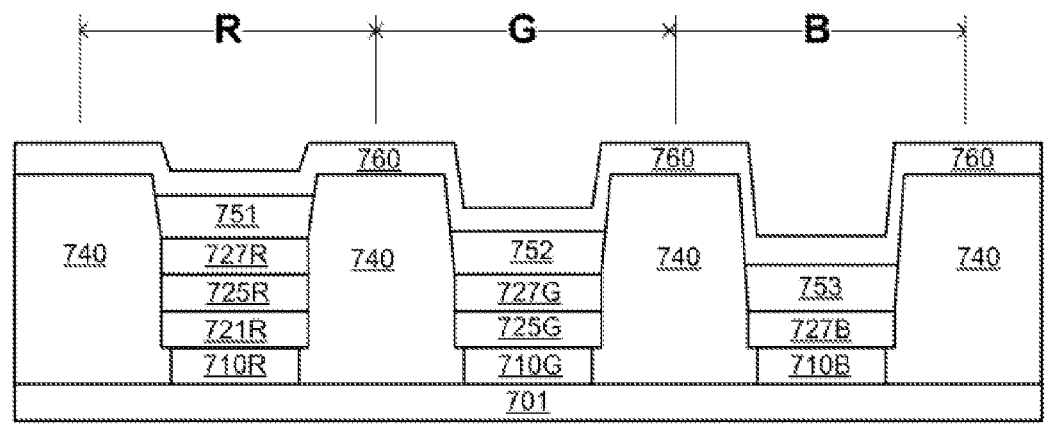

FIGS. 8A to 8O illustrate exemplary steps for a method of making three sub-pixel regions that each have a top emission OLED micro-cavity structure according to an exemplary embodiment of the invention. As shown in FIG. 8A, the method for making three sub-pixel regions that each have a top emission OLED micro-cavity structure starts on a substrate 701, which could be the flattening layer positioned above driving devices for the sub-pixel regions. A cavity electrode layer 710, which is substantially reflective for a top emission device, can be made of silver or a silver alloy that is deposited by sputtering on the substrate 701, as shown in FIG. 8B. As shown in FIG. 8C, a first transparent layer 721 of transparent material, such as ITO, of a first predetermined thickness is deposited on the cavity electrode layer 710. A first light exposure process patterns a photoresist 722 on the first transparent layer 721. As shown in FIG. 8D, a first patterned photoresist 722 is formed on the first transparent layer 721 in the red sub-pixel region R. A wet etch of the first transparent layer 721 using, for example, oxalic acid, forms a first transparent electrode 721R in the red sub-pixel region R. The formation of the first transparent electrode 721R in the red sub-pixel region R results in some residue 721' around the first transparent electrode 721R, as shown in FIG. 8E.

As shown in FIG. 8F, the second transparent layer 725 of transparent material, such as ITO, of a second predetermined thickness is deposited over the cavity electrode layer 710 and the first transparent electrode 721R in the red sub-pixel region R. A second light exposure process patterns a photoresist 726 on the second transparent layer 725. As shown in FIG. 8G, a second patterned photoresist 726 is formed on the second transparent layer 725 in the red sub-pixel region R and on the second transparent layer 725 in the green sub-pixel region G. A wet etch of the second transparent layer 725 using, for example, oxalic acid, forms a second transparent electrode 725R on the first transparent electrode 721R in the red sub-pixel region R and a first transparent electrode 725G in the green sub-pixel region G. The formation of the second transparent electrode 725R in the red sub-pixel region R and the first transparent electrode 725G in the green sub-pixel region G results in additional residue 725' around the first transparent electrode 721R and the second transparent electrode 725R and also around the first transparent electrode 725G, as shown in FIG. 8H.

As shown in FIG. 8I, the third transparent layer 727 of transparent material, such as ITO, of a third predetermined thickness is deposited over the cavity electrode layer 710, the second transparent electrode 725R in the red sub-pixel region R, and the first transparent electrode 725G in the green sub-pixel region G. A third light exposure process patterns a photoresist 728 on the third transparent layer 727. As shown in FIG. 8I, a third patterned photoresist 728 is formed on the third transparent layer 727 in the red sub-pixel region R, on the third transparent layer 727 in the green sub-pixel region G, and on the third transparent layer 727 in the blue sub-pixel region B. A wet etch of the third transparent layer 727 using, for example, oxalic acid, forms a third transparent electrode 727R on the second transparent electrode 725R in the red sub-pixel region R, a second transparent electrode 727G on the first transparent electrode 725G in the green sub-pixel region G, and a first transparent electrode 727B in the blue sub-pixel region B. The formation of the third transparent electrode 727R in the red sub-pixel region R, the second transparent electrode 725G in the green sub-pixel region G and the first transparent electrode 727B in the blue sub-pixel region B results in more residue 727' around the first transparent electrode 721R, the second transparent electrode 725R, the third transparent electrode 727R and also around the first transparent electrode 725G and the second transparent electrode 727G and also around the first transparent electrode 727B, as shown in FIG. 8J.

The residues 721', 725' and 727' can accumulate from the etching of the first, second and third transparent layers 721, 725 and 727. The residues 721', 725' and 727' are conductive and can cause short circuiting between adjacent sub-pixels. As shown in FIG. 8J, the red and green sub-pixel regions R and G have the most accumulations such that short circuiting between the red and green sub-pixel regions R and G could occur if the residues 721', 725' and 727' were left to remain.

As shown in FIG. 8K, the residues 721', 725' and 727' are removed during a wet etching of cavity electrode layer 710 to form the cavity electrode 710R in the red sub-pixel region R, the cavity electrode 710G in the green sub-pixel region G and the cavity electrode 710B in the blue sub-pixel region B. For example, wet etchants for the cavity electrode layer 710 are composed of materials that can wet etch of metal materials, such as aluminium, silver, a silver alloy, other metal materials or a metal alloy composed of other metal materials. Also, the photoresist 728 on the third transparent layer 727 can be removed before the wet etching of the cavity electrode layer 710, or after the wet etching of the cavity electrode layer 710. That means the third transparent layer 727 or the photoresist 728 can be a mask for wet etching of the cavity electrode layer 710. During the wet etching of the cavity electrode layer 710, the first transparent electrode 721R in the red sub-pixel region R, the first transparent electrode 725G in the green sub-pixel region G and the first transparent electrode 727B in the blue sub-pixel region B respectively act as masks for the cavity electrode 710R in the red sub-pixel region R, the cavity electrode 710G in the green sub-pixel region G and the cavity electrode 710B in the blue sub-pixel region B. The wet etching of the cavity electrode layer 710 undercuts beneath the first transparent electrode 721R in the red sub-pixel region R, the first transparent electrode 725G in the green sub-pixel region G and the first transparent electrode 727B in the blue sub-pixel region B. Thus, the cavity electrode 710R in the red sub-pixel region R, the cavity electrode 710G in the green sub-pixel region G and the cavity electrode 710B in the blue sub-pixel region B respectively overlap past the sides of the first transparent electrode 721R in the red sub-pixel region R, the first transparent electrode 725G in the green sub-pixel region G and the first transparent electrode 727B in the blue sub-pixel region B by a distance U, as shown in FIG. 8L.

As shown in FIG. 8M, banks 740 of insulating material are then formed at the periphery of the sub-pixel regions R, G, and B to separate and isolate both the transparent and cavity electrodes of a sub-pixel region from the transparent and cavity electrodes of another sub-pixel region. As shown in FIG. 8N, a red emissive layer 751 is deposited on the third transparent electrode 727R in the red sub-pixel region R, a green emissive layer 752 is deposited on the second transparent electrode 727G in the green sub-pixel region G, and a blue emissive layer 753 is deposited on the first transparent electrode 727B in the blue sub-pixel region B. Since all of the red, green and blue emissive layers 751, 752 and 753 have the same thickness, each can be highly defined using an evaporation deposition technique with a fine metal mask. Alternatively, a continuous white emissive layer can be deposited across the sub-pixels of an OLED display with each sub-pixel having a color filter for that color of the sub-pixel.

As shown in FIG. 8O, a common cathode 760 is deposited across the banks 740 and the red, green and blue emissive layers 751, 752 and 753. The common cathode 760 is both reflective and semi-transmissive for a top emission OLED device and can be made of, for example, a very thin layer of an alloy of silver and magnesium.

The depth of the micro-cavity CDR in the red sub-pixel region R is the combined thicknesses of the first anode layer 721R, the second anode layer 725R, the third anode layer 727R and the red emissive layer 751. The depth of the micro-cavity CDG in the green sub-pixel region G is the combined thicknesses of the first anode layer 725G and second anode layer 727G and the green emissive layer 752. The depth of the micro-cavity CDB in the blue sub-pixel region B is the combined thicknesses of the first anode layer 727B in the blue sub-pixel region B and the blue emissive layer 753. Because the thickness of each emissive layer is the same in exemplary embodiments of the invention, the depth of a micro-cavity for a sub-pixel is based on the number of anode layers in the sub-pixels. There are three masks used in three light exposure steps to provide the appropriate number of anode layers in each of the sub-pixels.

Figure 9A:
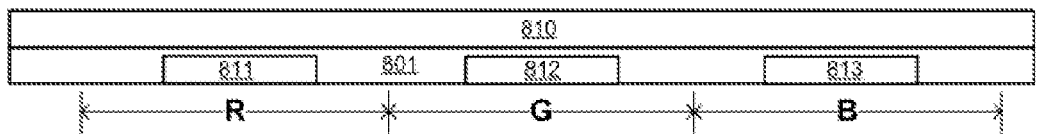
FIGS. 9A to 9M illustrate exemplary steps for a method of making three sub-pixel regions that each have a bottom emission OLED micro-cavity structure according to an exemplary embodiment of the invention.

FIGS. 9A to 9M illustrate exemplary steps for a method of making three sub-pixel regions that each have a bottom emission OLED micro-cavity structure according to an exemplary embodiment of the invention. As shown in FIG. 9A, the method for making three sub-pixel regions that each have a bottom emission OLED micro-cavity structure starts on a substrate 801, which could be the flattening layer positioned above driving devices for the sub-pixel regions. A red color filter 811, a green color filter 812 and a blue color filter 813 correspond respectively to red, green and blue sub-pixel regions R, G, and B of the substrate 801. A cavity electrode layer 810, which is both semi-transmissive and reflective for a bottom emission device, can be made of a very thin layer of silver or a silver alloy deposited by sputtering on the substrate 801, as shown in FIG. 9B.

Figure 9B:
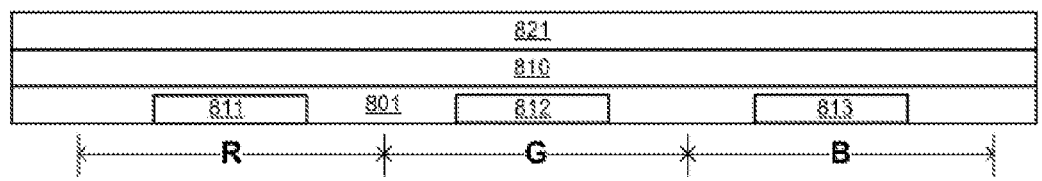
Figure 9C:
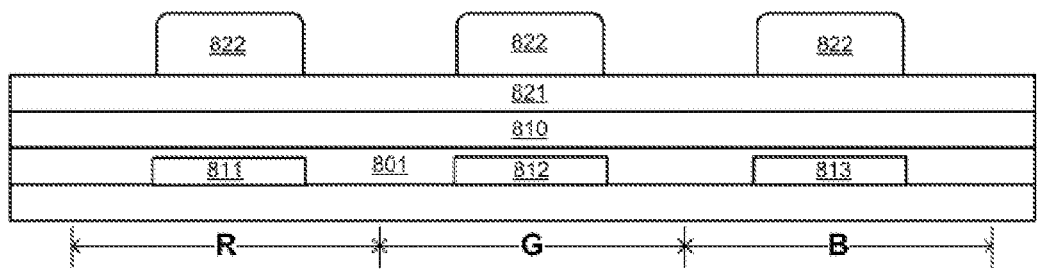
Figure 9D:
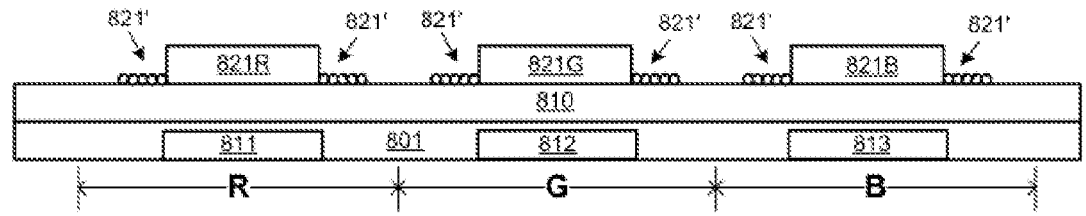

As shown in FIG. 9B, a first transparent layer 821 of transparent material, such as ITO, of a first predetermined thickness is deposited on the cavity electrode layer 810. A first light exposure process patterns a photoresist 822 on the first transparent layer 821. As shown in FIG. 9C, a first patterned photoresist 822 is formed on the first transparent layer 821 in the red, green and blue sub-pixel regions R, G, and B. A wet etch of the first transparent layer 821 using, for example, oxalic acid, forms a first transparent electrode 821R in the red sub-pixel region R, a first transparent electrode 821G in the green sub-pixel region G, and a first transparent electrode 821B in the blue sub-pixel region B, as shown in FIG. 9D. The formation of the first transparent electrodes 821R, 821G and 821B in the red, green and blue sub-pixel regions R, G, and B results in some residue 821' around the first transparent electrodes 821R, 821B and 821G respectively in the red, green and blue sub-pixel regions R, G, and B, as shown in FIG. 9D.

Figure 9E:
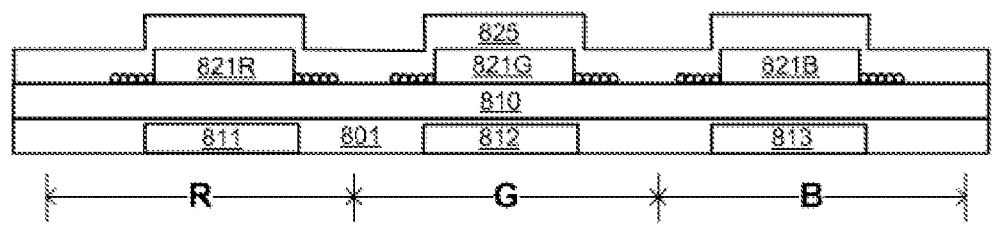
Figure 9F:
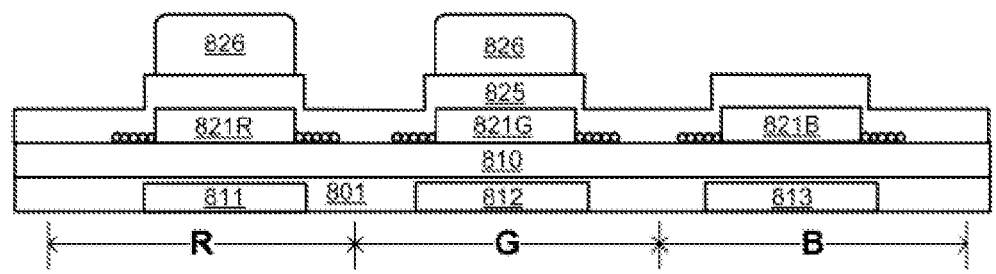
Figure 9G:
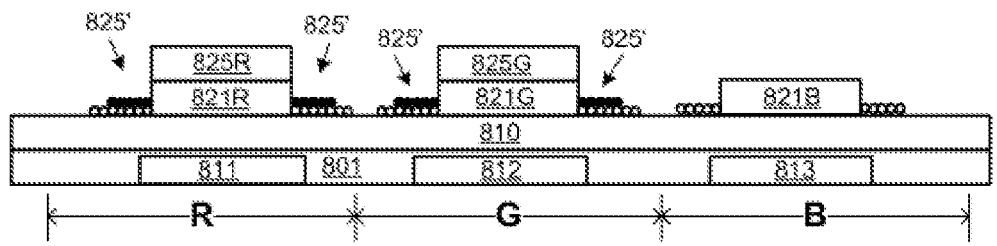

As shown in FIG. 9E, a second transparent layer 825 of transparent material, such as ITO, of a second predetermined thickness is deposited over the cavity electrode layer 810 and the first transparent electrodes 821R, 821G and 821B in the red, green and blue sub-pixel regions R, G, and B. A second light exposure process patterns a photoresist 826 on the second transparent layer 825. As shown in FIG. 9F, a second patterned photoresist 826 is formed on the second transparent layer 825 in the red sub-pixel region R and on the second transparent layer 825 in the green sub-pixel region G. A wet etch of the second transparent layer 825 using, for example, oxalic acid, forms a second transparent electrode 825R on the first transparent electrode 821R in the red sub-pixel region R and a second transparent electrode 825G on the first transparent electrode 821G in the green sub-pixel region G, as shown in FIG. 9G. The formation of the second transparent electrode 825R in the red sub-pixel region R and the second transparent electrode 825G in the green sub-pixel region G results in additional residue 825' around the first transparent electrode 821R in the red sub-pixel region R and also around the first transparent electrode 821G in the green sub-pixel region G, as shown in FIG. 9G.

Figure 9H:
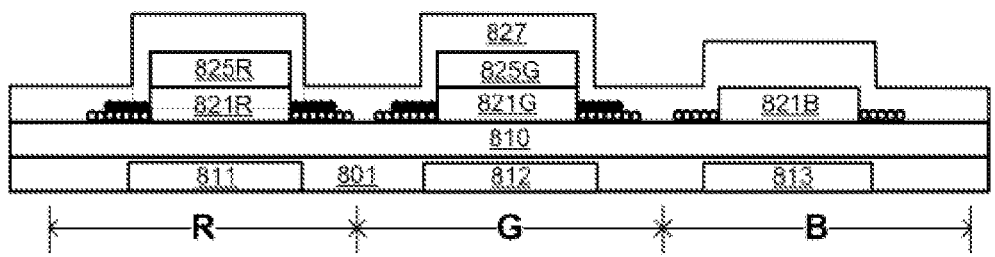
Figure 9I:
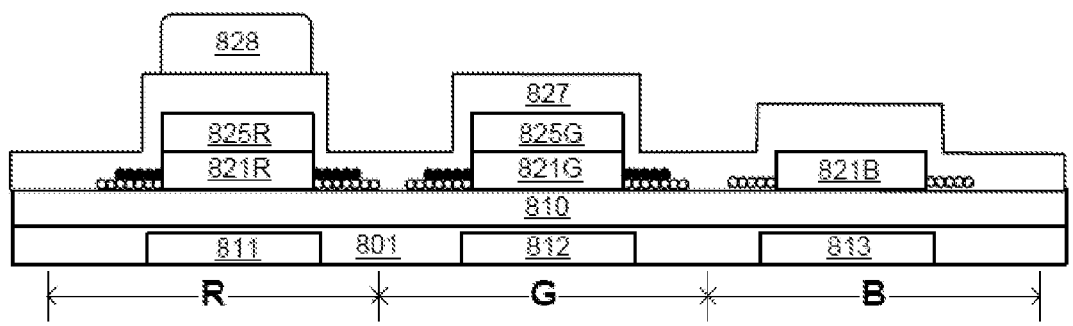
Figure 9J:
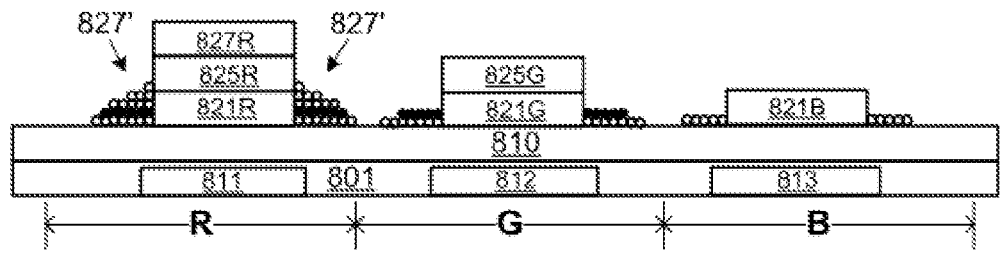

As shown in FIG. 9H, the third transparent layer 827 of transparent material, such as ITO, of a third predetermined thickness is deposited over the cavity electrode layer 810, the second transparent electrode 825R in the red sub-pixel region R, the second transparent electrode 825G in the green sub-pixel region G, and the first transparent electrode 821B in the blue sub-pixel region B. A third light exposure process patterns a photoresist 828 on the third transparent layer 827. As shown in FIG. 9I, a third patterned photoresist 828 is formed on the third transparent layer 827 in the red sub-pixel region R. A wet etch of the third transparent layer 827 using, for example, oxalic acid, forms a third transparent electrode 827R on the second transparent electrode 825R in the red sub-pixel region R. The formation of the third transparent electrode 827R in the red sub-pixel region R results in more residue 827' around the first transparent electrodes 821R in the red sub-pixel region R, as shown in FIG. 9J.

The residues 821', 825' and 827' can accumulate from the etching of the first, second and third transparent layers 821, 825 and 827. The residues 821', 825' and 827' are conductive and can cause short circuiting between adjacent sub-pixels. As shown in FIG. 9J, the red and green sub-pixel regions R and G have the most accumulations such that short circuiting between the red and green sub-pixel regions R and G could occur if the residues 721', 725' and 727' were left to remain.

Figure 9K:
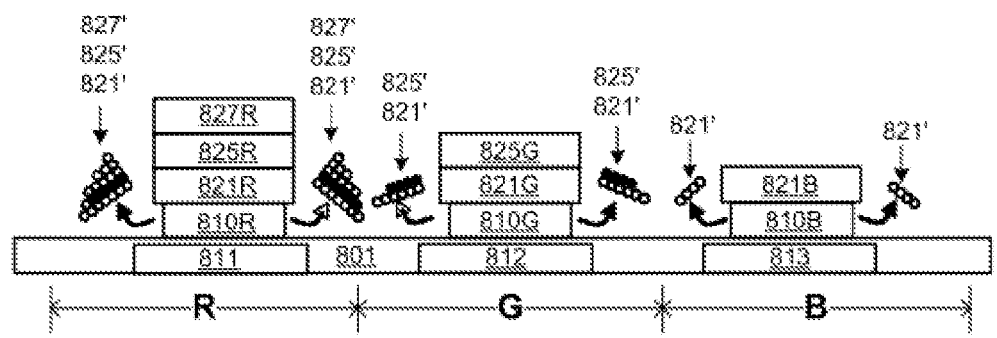

As shown in FIG. 9K, the residues 821', 825' and 827' are removed during a wet etching of cavity electrode layer 810 to form the cavity electrode 810R in the red sub-pixel region R, the cavity electrode 810G in the green sub-pixel region G and the cavity electrode 810B in the blue sub-pixel region B. For example, wet etchants for the cavity electrode layer 810 are composed of materials that can wet etch of metal materials, such as aluminium, silver, a silver alloy, other metal materials or a metal alloy composed of other metal materials. Also, the photoresist 828 on the third transparent layer 827 can be removed before the wet etching of the cavity electrode layer 810, or after the wet etching of the cavity electrode layer 810. That means the third transparent layer 827 or the photoresist 828 can be a mask for wet etching of the cavity electrode layer 810. During the wet etching of the cavity electrode layer 810, the first transparent electrode 821R in the red sub-pixel region R, the first transparent electrode 821G in the green sub-pixel region G and the first transparent electrode 821B in the blue sub-pixel region B respectively act as masks for the cavity electrode 810R in the red sub-pixel region R, the cavity electrode 810G in the green sub-pixel region G and the cavity electrode 810B in the blue sub-pixel region B. The wet etching of the cavity electrode layer 810 undercuts beneath the first transparent electrode 821R in the red sub-pixel region R, the first transparent electrode 821G in the green sub-pixel region G and the first transparent electrode 821B in the blue sub-pixel region B. Thus, the cavity electrode 810R in the red sub-pixel region R, the cavity electrode 810G in the green sub-pixel region G and the cavity electrode 810B in the blue sub-pixel region B respectively overlap past the sides of the first transparent electrode 821R in the red sub-pixel region R, the first transparent electrode 821G in the green sub-pixel region G and the first transparent electrode 821B in the blue sub-pixel region B, as shown in FIG. 9K.

Figure 9L:
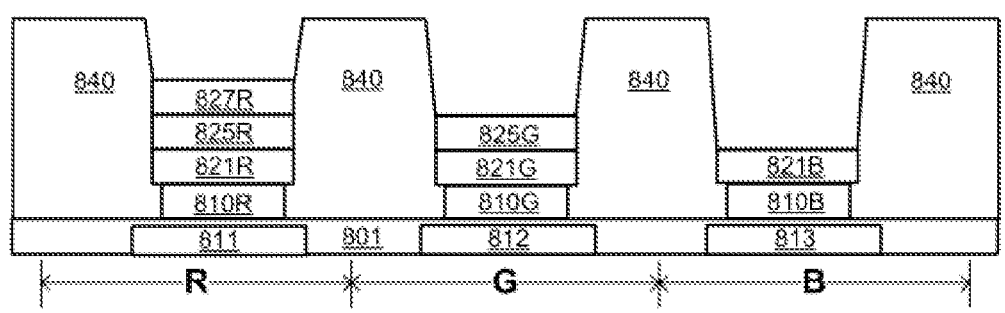
Figure 9M:
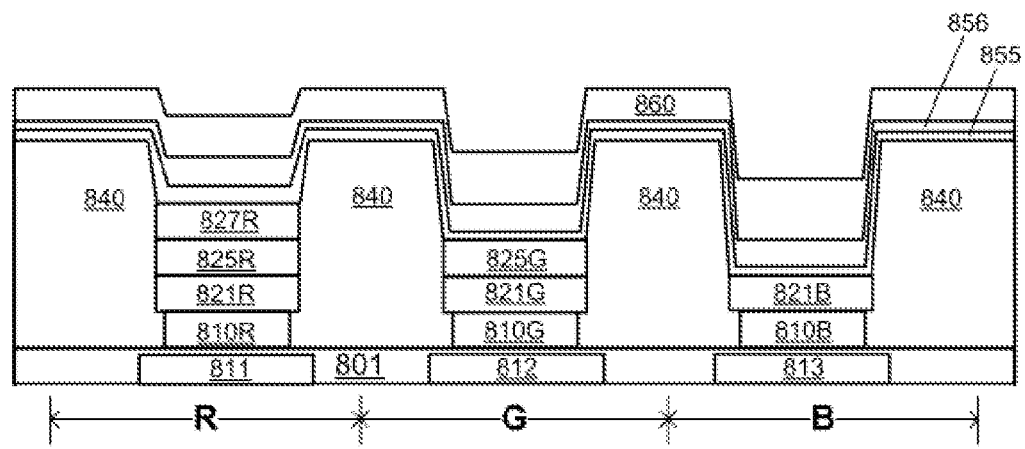

As shown in FIG. 9L, banks 840 of insulating material are then formed at the periphery of the sub-pixel regions R, G, and B to separate and isolate both the transparent and cavity electrodes a sub-pixel region from the transparent and cavity electrodes of another sub-pixel region. As shown in FIG. 9M, a blue emissive layer 855 and then a yellow emissive layer 856 is deposited on the third transparent electrode 827R in the red sub-pixel region R, the second transparent electrode 825G in the green sub-pixel region G, the first transparent electrode 821B in the blue sub-pixel region B and the banks 840. Alternatively, pairs of yellow and green emissive layers can be positioned in each of the sub-pixels between the banks 840. A common cathode 860 is deposited on the yellow emissive layer 856. The common cathode 860 is substantially reflective and can be made of, for example, silver, silver alloy or some other reflective material.

Figure 10:
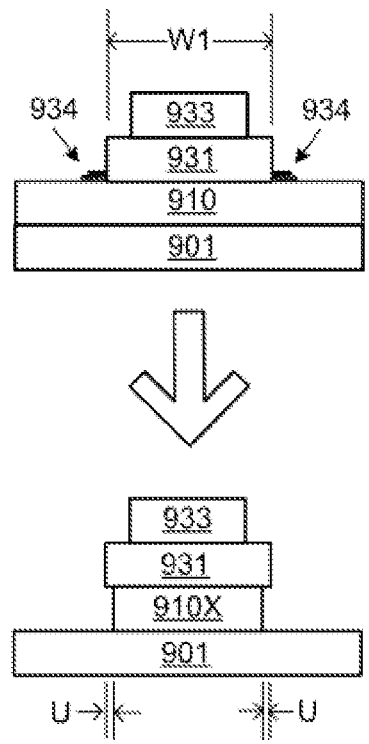
FIG. 10 shows the etching of a cavity electrode when a width of a lower transparent electrode on a cavity electrode layer is larger than the width of an upper transparent electrode on the lower transparent electrode.

FIG. 10 shows the etching of a cavity electrode when a width of a lower transparent electrode on a cavity electrode layer is larger than the width of an upper transparent electrode on the lower transparent electrode. As shown in FIG. 10, a transparent electrode stack of a second transparent electrode 933 and a first transparent electrode 931 is formed on a cavity electrode layer 910, which is on a substrate 901, and then a wet etch of the cavity electrode layer 910 occurs to form a patterned cavity electrode 910X. The residue 934 from the formation of the first and second transparent electrodes 931 and 933 is removed by the wet etch. The width W1 of the first transparent electrode 931 determines the width of the patterned cavity electrode 910X. Further, the cavity electrode 910X is undercut by a distance U on both sides of the first transparent electrode 931. The second transparent electrode 933 has no affect on the patterning because the second transparent electrode 933 is within the periphery of the first transparent electrode 931. There are instances were a second transparent electrode, a third transparent electrode or some combination of first, second and third transparent electrodes can affect the patterning of the cavity electrode positioned below the first transparent electrode. The cavity electrode 910X can be reflective or semi-transmissive and can be applied to a top emission OLED device or a bottom emission OLED device.

Figure 11:
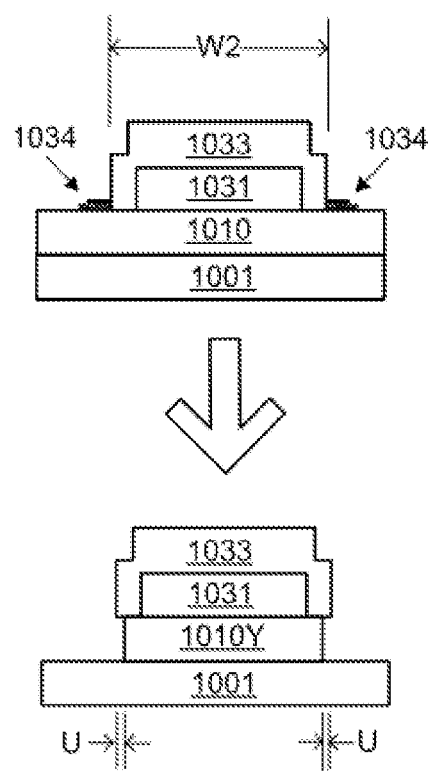
FIG. 11 shows the etching of a cavity electrode when a width of a lower transparent electrode on a cavity electrode layer is smaller than the width of an upper transparent electrode on the lower transparent electrode.

FIG. 11 shows the etching of a cavity electrode when a width of a lower transparent electrode on a cavity electrode layer is smaller than the width of an upper transparent electrode on the lower transparent electrode. As shown in FIG. 11, a transparent electrode stack of a second transparent electrode 1033 and a first transparent electrode 1031 is formed on a cavity electrode layer 1010, which is on a substrate 1001, and then a wet etch of the cavity electrode layer 1010 occurs to form a patterned cavity electrode 1010Y. The residue 1034 from the formation of the first and second transparent electrodes 1031 and 1033 is removed by the wet etch. The first transparent electrode 1031 was unintentionally patterned to be smaller than the second transparent electrode 1033. The width W2 of the second transparent electrode 1033 determines the width of the patterned cavity electrode 1010Y because the second transparent electrode 1033 overlaps down both sides of the first transparent electrode 1031 due to the unintentional patterning of the second transparent electrode 1033. Further, the cavity electrode 1010Y is undercut by a distance U on both sides of the second transparent electrode 1033. Although the resultant cavity electrode 1010Y may be slightly wider than other cavity electrodes of other sub-pixels, the residue 1034 is removed and the cavity electrode 1010Y is appropriately patterned to the transparent electrode stack of the second transparent electrode 1033 and the first transparent electrode 1031. The cavity electrode 1010Y can be reflective or semi-transmissive and can be applied to a top emission OLED device or a bottom emission OLED device.

Figure 12:
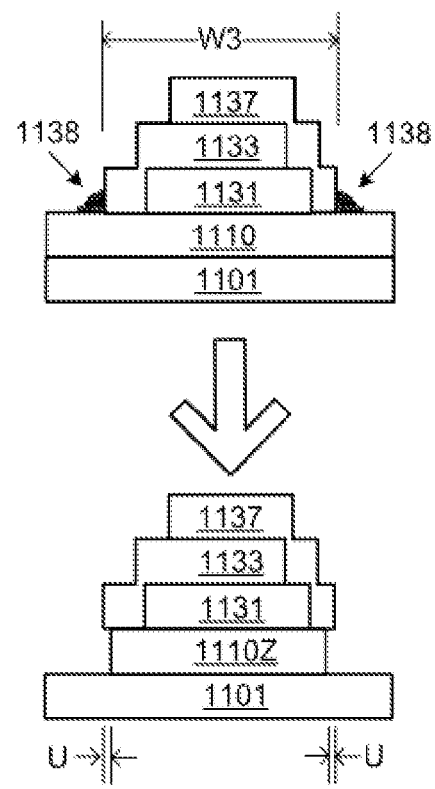
FIG. 12 shows the etching of a cavity electrode when a width of a lower transparent electrode on a cavity electrode layer is smaller than the combined width of two misaligned upper transparent electrodes located above the lower transparent electrode.

FIG. 12 shows the etching of a cavity electrode when a width of a lower transparent electrode on a cavity electrode layer is smaller than the combined width of two misaligned upper transparent electrodes located above the lower transparent electrode. As shown in FIG. 12, a transparent electrode stack of a third transparent electrode 1137, a second transparent electrode 1133 and a first transparent electrode 1131 is formed on a cavity electrode layer 1110, which is on a substrate 1101, and then a wet etch of the cavity electrode layer 1110 occurs to form a patterned cavity electrode 1110Z. The residue 1138 from the formation of the first, second and third transparent electrodes 1131, 1133 and 1137 is removed by the wet etch. The third transparent electrode 1137 was unintentionally patterned to be on one side of the first transparent electrode 1131. The second transparent electrode 1133 was unintentionally patterned to be on the other side of the first transparent electrode 1131. The width W3 of a combination of the second transparent electrode 1133 on one side of the first transparent electrode 1131 and the third transparent electrode 1137 on the other side of the first transparent electrode 1131 determines the width of the patterned cavity electrode 1110Z. Further, the cavity electrode 1110Z is undercut by a distance U on both the second transparent electrode 1133 on one side and the third transparent electrode 1137 on the other side. Although the resultant cavity electrode 1110Z may be slightly wider than other cavity electrodes of other sub-pixels, the residue 1134 is removed and the cavity electrode 1110Z is appropriately patterned to the transparent electrode stack of the third transparent electrode (1137), the second transparent electrode 1133 and the first transparent electrode 1131. The cavity electrode 1110Z can be reflective or semi-transmissive and can be applied to a top emission OLED device or a bottom emission OLED device.

It will be apparent to those skilled in the art that various modifications and variations can be made in the embodiments of the invention without departing from the spirit or scope of the invention. Thus, it is intended that embodiments of the invention cover the modifications and variations of this invention provided they come within the scope of the appended claims and their equivalents.

What is claimed is:

1. An organic light emitting diode, comprising:
    a plurality of pixels on a substrate, each pixel having first through third micro-cavity regions;
    a driving transistor in each pixel;
    a passivation layer for passivating the driving transistor;
    a first cavity electrode in the first micro-cavity region of the substrate;
    a first transparent electrode on the first cavity electrode in the first micro-cavity region, the first transparent electrode comprising a first transparent electrode structure which comprises three layers having same width and extends beyond both sides of the first cavity electrode;
    a first emissive layer in electrical connection with the first transparent electrode; and
    a cathode layer on the first emissive layer, wherein:
        the three layers of the first transparent electrode are formed by etching transparent layers sequentially, thereby resulting in residues around the first transparent electrode; and
        the first cavity electrode is formed by etching a cavity electrode layer, thereby removing the residues during the etching the cavity electrode layer; and
        the both side surfaces of the first cavity electrode do not contact the first transparent electrode structure.

2. The organic light emitting diode of claim 1, wherein the cathode layer is semi-transmissive.

3. The organic light emitting diode of claim 1, wherein the first cavity electrode is reflective.

4. The organic light emitting diode of claim 1, wherein the first cavity electrode is semi-transmissive.

5. The organic light emitting diode according to claim 1, further comprising:
    a second cavity electrode in a second micro-cavity region of the substrate;
    a third cavity electrode in a third micro-cavity region of the substrate;
    a second transparent electrode structure comprising two layers that have same width in the second micro-cavity region, wherein the second transparent electrode structure extends beyond both sides of the second cavity electrode;
    a third transparent electrode structure comprising one layer in the third micro-cavity region, wherein the third transparent electrode structure extends beyond both sides of the third cavity electrode;
    a second emissive layer in electrical connection with the second transparent electrode structure of the second micro-cavity region; and
    a third emissive layer in electrical connection with the third transparent electrode structure of the third micro-cavity region, wherein the cathode layer is on the second and third emissive layers.

6. The organic light emitting diode of claim 5, wherein the cathode layer comprises a first cathode layer in the first micro-cavity region, a second cathode layer in the second micro-cavity region, a third cathode layer in the third micro-cavity region.

7. The organic light emitting diode of claim 5, wherein the second and third cavity electrodes are reflective.

8. The organic light emitting diode of claim 5, wherein the second and third cavity electrodes are semi-transmissive.

9. The organic light emitting diode of claim 5, wherein the first, second and third emissive layers emit a same color.

10. The organic light emitting diode of claim 1, wherein both side surfaces of the first cavity electrode does not contact with the first transparent electrode.

11. The organic light emitting diode of claim 10, further comprising a bank between the first micro-cavity region and the second micro-cavity region and between the second micro-cavity region and the third micro-cavity region,
wherein the both side surfaces of the first cavity electrode directly contact with the bank.

12. An organic light emitting diode on a substrate, comprising:
a first cavity electrode comprising one layer having a first width in a first micro-cavity region of the substrate;
a first transparent electrode structure comprising three layers having a second width and positioned on the first cavity electrode;
a first emissive layer in electrical connection with the first transparent electrode;
a cathode layer on the first emissive layer;
a driving transistor; and
a passivation layer for passivating the driving transistor, wherein:
the three layers of the first transparent electrode structure are formed by etching transparent layers sequentially, thereby resulting in residues around the first transparent electrode structure;
the first cavity electrode is formed by etching a cavity electrode layer, thereby the residues are removed, the second width becomes larger than the first width and the first transparent electrode structure extends beyond both a first side of the first cavity electrode and a second side of the first cavity electrode opposite to the first side, and the both side surfaces of the first cavity electrode do not contact the first transparent electrode structure.

13. The organic light emitting diode of claim 12, wherein the first cavity electrode is reflective.

14. The organic light emitting diode of claim 12, wherein the first cavity electrode is semi-transmissive.

15. The organic light emitting diode of claim 12, wherein the cathode layer electrode is reflective.

16. The organic light emitting diode of claim 12, wherein the cathode layer electrode is semi-transmissive.

17. The organic light emitting diode of claim 12, further comprising a bank between the first micro-cavity region and the second micro-cavity region and between the second micro-cavity region and the third micro-cavity region;
wherein the both side surfaces of the first cavity electrode directly contact with the bank.

* * * * *